United States Patent
Wu et al.

(10) Patent No.: US 12,426,246 B2
(45) Date of Patent: Sep. 23, 2025

(54) SEMICONDUCTOR STRUCTURE AND METHOD FOR FORMING SAME

(71) Applicant: CHANGXIN MEMORY TECHNOLOGIES, INC., Hefei (CN)

(72) Inventors: Gongyi Wu, Hefei (CN); Ruigen Ding, Hefei (CN); Xianxian Tang, Hefei (CN); Nan Deng, Hefei (CN); Yuchen Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 391 days.

(21) Appl. No.: 18/177,813

(22) Filed: Mar. 3, 2023

(65) Prior Publication Data
US 2023/0209806 A1  Jun. 29, 2023

Related U.S. Application Data

(63) Continuation of application No. PCT/CN2021/120736, filed on Sep. 26, 2021.

(30) Foreign Application Priority Data

Mar. 26, 2021 (CN) .......................... 202110326564.4

(51) Int. Cl.
H10B 12/00 (2023.01)

(52) U.S. Cl.
CPC ....... H10B 12/315 (2023.02); H10B 12/0387 (2023.02); H10B 12/37 (2023.02); H10B 12/482 (2023.02); H10B 12/485 (2023.02)

(58) Field of Classification Search
CPC ........... H01L 21/76897; H01L 23/5222; H01L 21/76831; H01L 21/76895; H01L 21/76805

See application file for complete search history.

(56) References Cited

U.S. PATENT DOCUMENTS 6,329,241 B1  12/2001  Lin
6,534,813 B1   3/2003  Park
(Continued)

FOREIGN PATENT DOCUMENTS

CN  1339172 A  3/2002
CN  1917211 A  2/2007
(Continued)

OTHER PUBLICATIONS

International Search Report in the international application No. PCT/CN2021/120736, mailed on Jul. 22, 2022, 2 pages.
(Continued)

*Primary Examiner* — Edward Chin
(74) *Attorney, Agent, or Firm* — SYNCODA LLC; Feng Ma

(57) ABSTRACT

Semiconductor structure and method forming the same are provided. The method includes: providing a substrate and discrete conductive structures on the substrate; forming an insulating layer on an upper surface of each of the conductive structures; forming an isolation structure on a side wall of each of the conductive structures and on a side wall of each of the insulating layers; removing part of the isolation structure located on the side wall of the insulating layer; removing part of the insulating layer that is far away from a respective one of the conductive structures, to form and surround trenches by a surface of the substrate, the side walls of the isolation structures and the side walls of the insulating layers, a width of an opening of each trench being larger than a width of a bottom of each trench in a direction perpendicular to side walls of the trenches.

14 Claims, 10 Drawing Sheets

(56) References Cited

U.S. PATENT DOCUMENTS

| | | |
|---|---|---|
| 6,720,269 B2 | 4/2004 | Park |
| 6,875,690 B2 | 4/2005 | Kim |
| 7,326,613 B2 | 2/2008 | Yun |
| 10,373,957 B2 | 8/2019 | Chang et al. |
| 11,107,820 B2 | 8/2021 | Huang |
| 11,133,319 B2 | 9/2021 | Ho |
| 2003/0127677 A1 | 7/2003 | Park |
| 2004/0119170 A1 | 6/2004 | Kim |
| 2005/0218408 A1 | 10/2005 | Yun |
| 2015/0179651 A1 | 6/2015 | Park et al. |
| 2016/0329337 A1* | 11/2016 | Hwang .............. H10B 12/0335 |
| 2019/0312037 A1 | 10/2019 | Chang et al. |
| 2021/0091088 A1 | 3/2021 | Tsai |
| 2021/0091089 A1 | 3/2021 | Ho |
| 2021/0375878 A1* | 12/2021 | Zhang ................. H10B 12/315 |

FOREIGN PATENT DOCUMENTS

| | | |
|---|---|---|
| CN | 106992175 A | 7/2017 |
| CN | 107910328 A | 4/2018 |
| CN | 108269789 A | 7/2018 |
| CN | 110718550 A | 1/2020 |
| CN | 110970436 A | 4/2020 |
| CN | 111341728 A | 6/2020 |
| CN | 112510046 A | 3/2021 |
| CN | 112542458 A | 3/2021 |
| CN | 113078115 A | 7/2021 |

OTHER PUBLICATIONS

Notice of Allowance of the Chinese application No. 202110326564.4, issued on May 17, 2022, 8 pages.

* cited by examiner

SEMICONDUCTOR STRUCTURE AND METHOD FOR FORMING SAME

CROSS-REFERENCE TO RELATED APPLICATIONS

This is a continuation of International Patent Application No. PCT/CN2021/120736, filed on Sep. 26, 2021, which claims priority to Chinese Patent Application No. 202110326564.4, filed on Mar. 26, 2021. The disclosures of International Patent Application No. PCT/CN2021/120736 and Chinese Patent Application No. 202110326564.4 are hereby incorporated by reference in their entireties.

BACKGROUND

A Dynamic Random Access Memory (DRAM) is a semiconductor storage device commonly used in computers, and consists of many repeated storage cells. Each storage cell usually includes a capacitor and a transistor. A grid electrode of the transistor is connected to a word line, a drain electrode of the transistor is connected to a bit line, and a source electrode of the transistor is connected to the capacitor. A voltage signal on the word line can control the transistor on or off, and then data information stored in the capacitor is read through the bit line, or the data information is written into the capacitor through the bit line for storage.

As the size of a DRAM memory cell array becomes smaller and smaller, the size of its conductive contact window becomes smaller and smaller, which seriously affects the performance of a semiconductor structure.

How to increase the size of a conductive contact window of a semiconductor structure is an urgent problem to be solved by those skilled in the art.

SUMMARY

Embodiments of the present disclosure relate to the technical field of semiconductors, and in particular to a semiconductor structure and a method for forming the same.

In a first aspect, the embodiments of the present disclosure provide a method for forming a semiconductor structure, which may include the following operations. A substrate and a plurality of discrete conductive structures located on the substrate are provided. An insulating layer is formed on an upper surface of each of the conductive structures. An isolation structure located on a side wall of each of the conductive structures and on a side wall of each of the insulating layers is formed. A part of the isolation structure located on the side wall of the insulating layer is removed, an upper surface of the rest of the isolation structure being higher than the upper surface of each of the conductive structures. A part of the insulating layer that is far away from a respective one of the conductive structures is removed, a width of a top of the rest of the insulating layer being less than a width of a bottom of the rest of the insulating layer in a direction perpendicular to the side wall of the insulating layer. After removing the part of the insulating layer that is far away from the respective one of the conductive structures, a surface of the substrate, the side walls of the isolation structures and the side walls of the insulating layers form and surround trenches, a width of an opening of each of the trenches being larger than a width of a bottom of each of the trenches in a direction perpendicular to side walls of the trenches.

In a second aspect, the embodiments of the present disclosure also provide a semiconductor structure, which may include: a substrate and a plurality of discrete conductive structures located on the substrate; an insulating layer located on an upper surface of each of the conductive structures, a width of a top of the insulating layer being less than a width of a bottom of the insulating layer in a direction perpendicular to a side wall of the insulating layer; an isolation structure located on a side wall of each of the conductive structures and on a side wall of the insulating layer, the upper surface of each of the conductive structures being lower than an upper surface of the isolation structure; and trenches formed and surrounded by a surface of the substrate, the side walls of the isolation structures and the side walls of the insulating layers. A width of an opening of each of the trenches is larger than a width of a bottom of each of the trenches in a direction perpendicular to a side wall of each of the trenches.

BRIEF DESCRIPTION OF THE DRAWINGS

One or more embodiments are exemplarily described through the pictures in the attached drawings corresponding to them. These exemplary descriptions do not constitute a limit to the embodiments. The accompanying drawings do not constitute a scale limit unless otherwise stated.

DETAILED DESCRIPTION

It can be known from the background technology that the size of a conductive contact window of a semiconductor structure in the conventional art is too small.

Figure 1:
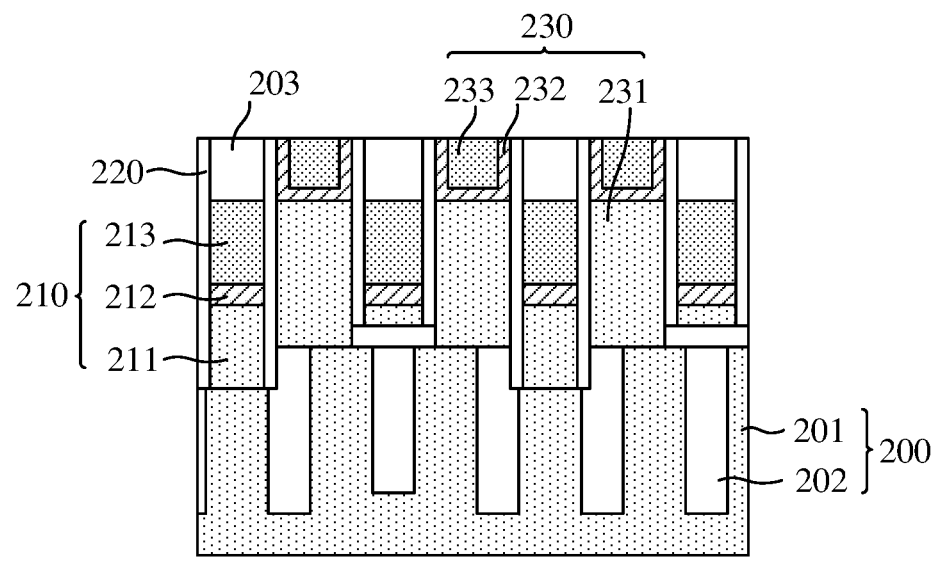
FIG. 1 is a structural schematic diagram of a semiconductor structure.

FIG. 1 is a structural schematic diagram of a semiconductor structure.

Referring to FIG. 1, analysis is given in combination with a semiconductor structure. The semiconductor structure may include: a substrate 200; a plurality of discrete conductive structures 210 located on the substrate; an insulating layer 203 on an upper surface of each of the conductive structures; an isolation structure 220 located on a side wall of each of the conductive structures 210 and on a side wall of the insulating layer 203; and trenches formed and surrounded by a surface of the substrate 200 and side walls of the isolation structures 220. A width of an opening of each of the trenches is the same as a width of a bottom of each of the trenches in a direction perpendicular to a side wall of each of the trenches. The trench is taken as a conductive contact window of the semiconductor structure. A conductive contact layer 230 fully fills a respective one of the trenches, so a width of a top of the conductive contact layer 230 is equal to a width of a bottom of the conductive contact layer 230 in a direction perpendicular to the side wall of the trench. Specifically, the substrate 200 includes an active area 201 and an isolation layer 202. The conductive structure 210 is a bit line structure, including a bit line contact layer 211, a bit line barrier layer 212 and a bit line conductive layer 213. The conductive contact layer 230 includes a capacitor contact layer 231, a capacitor barrier layer 232 and a capacitor conductive layer 233.

As can be seen from the above, the opening and the bottom of the conductive contact window in the semiconductor structure have the same width. Since the size of a DRAM memory cell array becomes smaller and smaller, the size of the conductive contact window becomes smaller and smaller. In the small space, if the size of a port where the conductive contact layer formed in the conductive contact window is electrically connected with other conductive structures formed later is small, the resistance value of the electrical connection is high, and the high resistance value will lead to poor contact, which seriously affects the performance of the semiconductor structure.

To solve the above problem, an embodiment of the present disclosure provides a semiconductor structure and a method forming the same. In the method, there are trenches among a plurality of discrete conductive structures. An upper surface of the conductive structure is provided with an insulating layer, and a width of a trench opening formed by removing part of the insulating layer is larger than a width of a bottom of the trench. When the trench is taken as the conductive contact window of the semiconductor structure, because the width of the upper surface of the conductive contact layer filling the conductive contact window is large, the conductive contact area is large, and the contact resistance is small; besides, because the conductive contact window is large, in the manufacturing process, the problems caused by the too small process dimension that the shape of the film layer formed is not standard or the removal is incomplete and there is residue in removing part of the film layer are reduced.

In order to make the purpose, technical solutions and advantages of the embodiments of the present disclosure clearer, the embodiments of the present disclosure will be described in detail below in combination with the accompanying drawings. However, those of ordinary skill in the art may understand that many technical details are presented in the embodiments of the present disclosure to make the present disclosure better understood by the reader. However, the technical solution claimed by the present disclosure may also be implemented even without these technical details, and changes and modifications based on the following embodiments.

FIG. 2 to FIG. 11 are structural schematic diagrams of steps in a method for forming a semiconductor structure provided in a first embodiment of the present disclosure.

Figure 2:
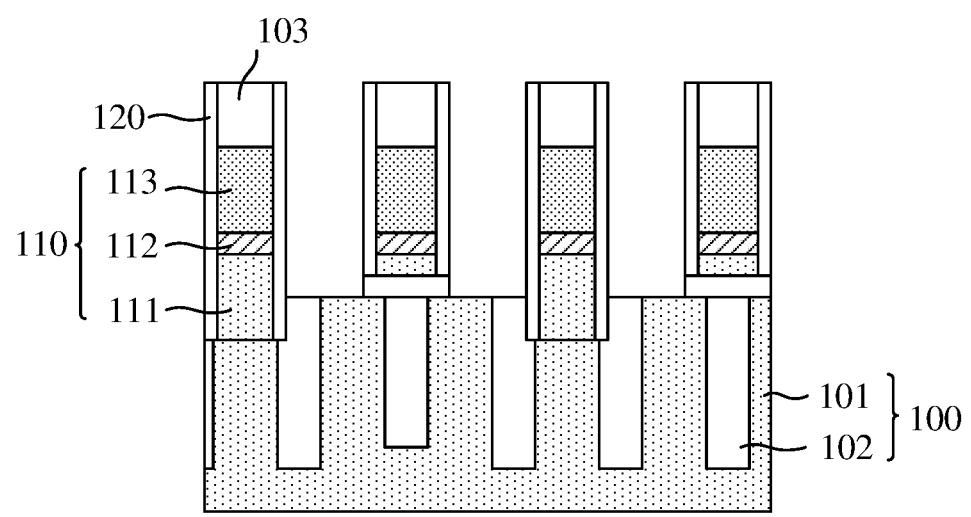
FIG. 2 to FIG. 11 are structural schematic diagrams of the steps in a method for forming a semiconductor structure provided in the first embodiment of the present disclosure.

Referring to FIG. 2, a substrate 100 and a plurality of discrete conductive structures 110 located on the substrate 100 are provided.

The substrate 100 includes a plurality of separate active areas 101, and each active area 101 has a source electrode and a drain electrode. The conductive structure 110 is electrically connected to the source electrode/drain electrode. The material of the active area 101 may be monocrystalline silicon, which has doped ions such as boron or phosphorus.

The substrate 100 also includes an isolation layer 102 for isolating adjacent active areas 101. The material of the isolation layer 102 is insulating material, such as silicon dioxide, silicon carbide or silicon nitride.

In the present embodiment, the conductive structure 110 is a bit line structure. The bit line structure includes a bit line contact layer 111, a bit line barrier layer 112, and a bit line conductive layer 113 which are stacked.

Specifically, the bit line contact layer 111 is used for electrically connecting the bit line conductive layer 113 to the active are 101, and its material may be polycrystalline silicon. The bit line conductive layer 113 has a low resistance, and its material may be tungsten or molybdenum. The bit line barrier layer 112 is used for blocking the mutual diffusion between the bit line conductive layer 113 and the bit line contact layer 111, and for increasing adhesion between the bit line conductive layer 113 and the bit line contact layer 111; and the material of the bit line barrier layer may be titanium nitrate or tantalum nitrate.

An insulating layer 103 is formed on an upper surface of each of the conductive structures 110. The insulating layer 103 is used for preventing the bit line conductive layer 113 from being oxidized, and the material of the insulating layer is an insulating material, such as silicon nitride.

An isolation structure 120 is formed on a side wall of each of the conductive structures 110 and on a side wall of each of the insulating layers 103.

In the present embodiment, the isolation structure 120 is a single-layer structure, and the material of the isolation structure 120 is silicon nitride, which mainly plays the role of isolation and insulation. In other embodiments, the isolation structure may also be a multi-layer structure.

In the present embodiment, the material of the isolation structure 120 is the same as that of the insulating layer 103.

The isolation structure 120 has large hardness and high density, which can improve the isolation effect to avoid the electrical connection between the bit line structure and an electrical contact structure formed later, thereby avoiding the problems such as short circuit or leakage. In addition, the isolation structure 120 has better resistance to corrosion, thereby avoiding being damaged during the cleaning process.

In the present embodiment, the isolation structure 120 is formed by an atomic layer deposition process. The atomic layer deposition process can improve the uniformity and density of a formed film layer. In other embodiments, the isolation structure may also be formed by a chemical vapor deposition process.

Figure 3:
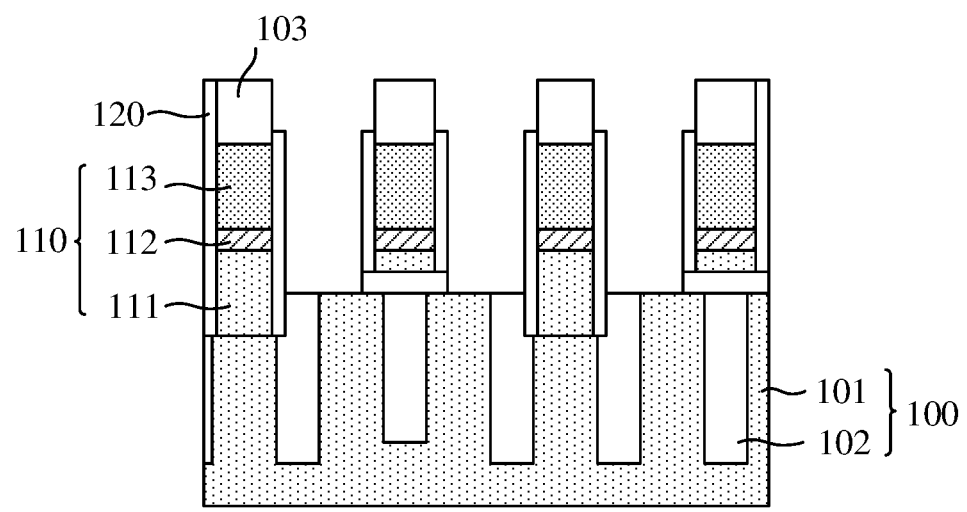

Referring to FIG. 3, a part of the isolation structure 120 located on the side wall of the insulating layer 103 is removed, an upper surface of the rest of the isolation structure 120 being higher than the upper surface of each of the conductive structures 110.

In the present embodiment, the isolation structure 120 located on the side wall of the insulating layer 103 is removed by isotropic etching. Since it is necessary to remove not only the insulating layer 103 and isolation structure 120 with a certain thickness in a direction perpendicular to the side wall of the trench, but also the insulating layer 103 and isolation structure 120 with a certain thickness in a direction parallel to the side wall of the trench, using the isotropic etching process can quickly perform etching in different directions, which is conducive to improving the etching efficiency.

It is to be noted that, generally, a wet etching process has good isotropy. It is a kind of pure chemical etching with excellent selectivity, so the width of lateral etching is close to the depth of vertical etching for either an oxide layer or a metal layer.

In the present embodiment, etching gases used in the wet etching process include difluoromethane and hydrofluoric acid. The gas flow rate of difluoromethane ranges from 180 standard milliliters per minute to 220 standard milliliters per minute, specifically is 190 standard milliliters per minute, 200 standard milliliters per minute or 210 standard milliliters per minute. The gas flow rate of hydrofluoric acid ranges from 280 standard milliliters per minute to 320 standard milliliters per minute, specifically is 290 standard milliliters per minute, 300 standard milliliters per minute or 310 standard milliliters per minute. A carrier gas used is oxygen or nitrogen. The gas flow rate of oxygen or nitrogen ranges from 80 standard milliliters per minute to 120 standard milliliters per minute, specifically is 90 standard milliliters per minute, 100 standard milliliters per minute or 110 standard milliliters per minute. When the flow rate is in the above range, the etching rate can be improved, and the process time can be shortened.

Figure 4:
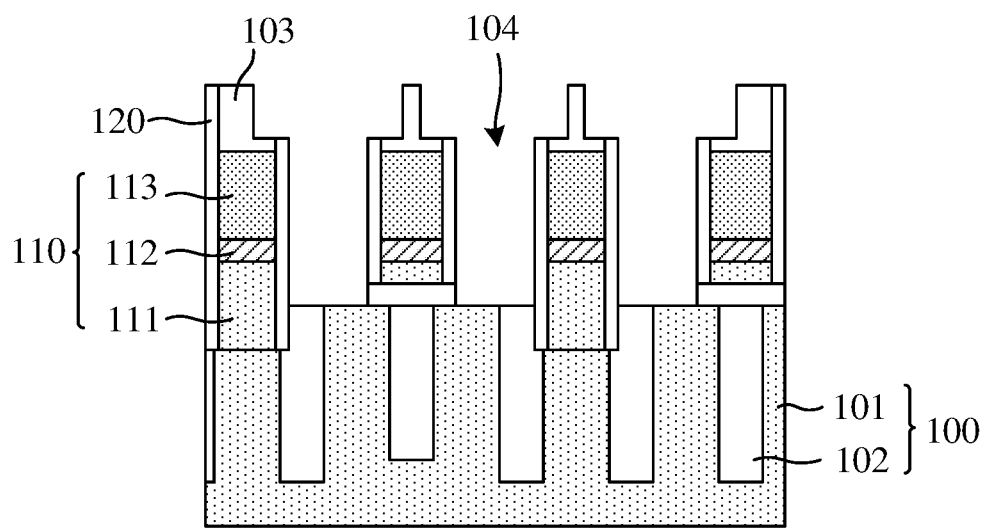

Referring to FIG. 4, a part of the insulating layer 103 that is far away from a respective one of the conductive structures 110 is removed. A width of a top of the rest of the insulating layer 103 is less than a width of a bottom of the rest of the insulating layer 103, in a direction perpendicular to the side wall of the insulating layer 103.

In the present embodiment, removing the part of the insulating layer 103 that is far away from the respective one of the conductive structures 110 specifically includes the following operations. Two opposite sides of a top of the insulating layer 103 are removed, so that grooves are formed at two ends of the top of each of the insulating layers 103. A bottom of each of the grooves is flush with the upper surface of the rest of the isolation structure 120.

In the present embodiment, because the material of the isolation structure 120 is the same as that of the insulating layer 103, the process used to remove the part of the insulating layer 103 that is far away from the respective one of the conductive structures 110 is the same as the process of removing the part of the isolation structure 120. For details, refer to the above method for removing the part of the isolation structure 120, and elaborations are omitted herein.

Moreover, because the upper surface of the isolation structure 120 after removal is flush with the bottom of the groove, the removal of the part of the isolation structure 120 and the removal of the part of the insulating layer 103 may be performed in the same step.

In the present embodiment, a thickness of each of the grooves accounts for 2.5% to 25%, specifically 5%, 10% or 20% of a thickness of each of the conductive structures 110 in a direction parallel to the side wall of each of the conductive structure 110s. A width of the groove is within this range, so that a width of a trench formed later is increased, and the effect of electrical insulation and isolation of the rest of the insulating layer 103 is not affected.

The thickness of each of the grooves ranges from 1 nanometer to 20 nanometers in the direction parallel to the side wall of each of the conductive structures 110, and specifically is 5 nanometers, 10 nanometers or 15 nanometers.

In the present embodiment, after the part of the insulating layer 103 that is far away from the respective one of the conductive structures 110 is removed, a surface of the substrate 100, the side walls of the isolation structures 120, and the side walls of the insulating layers 103 form and surround trenches 104. A width of an opening of each of the trenches 104 is larger than a width of a bottom of each of the trenches 104 in a direction perpendicular to side walls of the trenches 104.

The width of the opening of each of the trenches 104 is larger than the width of the bottom of each of the trenches 104. When the trench 104 is taken as the conductive contact window of the semiconductor structure later, because the width of the opening of the conductive contact window is large, the conductive contact area is large and the contact resistance is small; besides, because the conductive contact window is large, in the manufacturing process, the problems caused by the too small process dimension that the shape of a film layer formed is not standard or the removal is incomplete and there is residue in removing part of the film layer are reduced.

Figure 5:
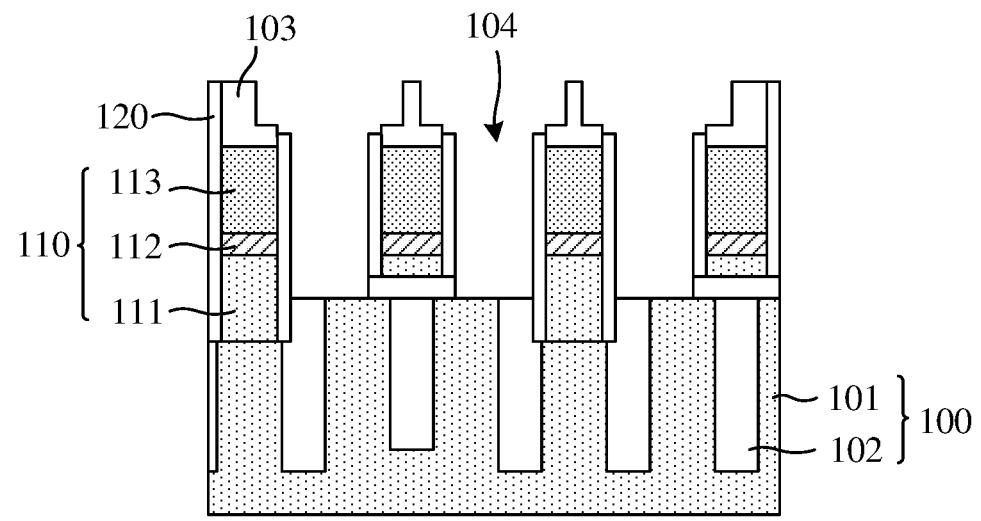

Referring to FIG. 5, in other embodiments, two opposite sides of a top of the insulating layer 103 are removed, so that grooves are formed at two ends of the top of each of insulating layers 103. A bottom of each of the grooves is higher than an upper surface of the rest of the isolation structure 120.

The bottom of each of the grooves is higher than the upper surface of the rest of the isolation structure 120, so that the width of the opening of the trench 104 is larger than the width of the bottom of the trench 104, and less insulating layer 103 is removed, thereby reducing the process time.

In the present embodiment, a conductive contact layer fully filling a respective one of the trenches 104 is formed. The conductive contact layer in one of the trenches is electrically insulated from the conductive contact layer in another one of the trenches.

In the present embodiment, the conductive contact layer is a capacitor contact structure. The step of forming the trench and the capacitor contact structure when the conductive contact layer is a capacitor contact structure will be described in detail below in combination with the accompanying drawings.

Figure 6:
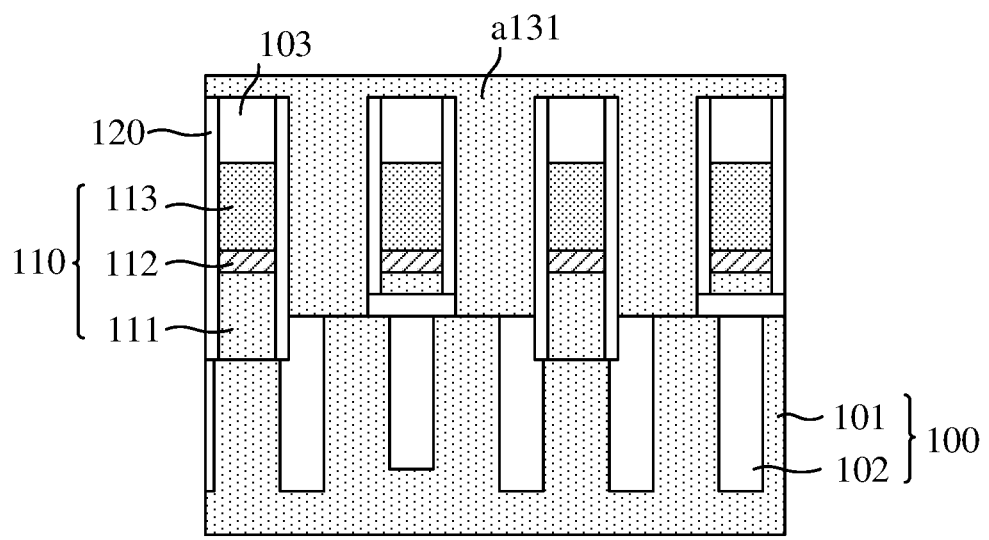

Referring to FIG. 6, after the isolation structure 120 is formed and before the part of the isolation structure 120 is removed, an initial capacitor contact layer a131 is formed between the isolation structures 120, on the upper surfaces of the isolation structures 120 and the upper surfaces of the insulating layers 103.

The initial capacitor contact layer a131 is formed by the chemical vapor deposition process. The material of the initial capacitor contact layer a131 is polycrystalline silicon. The polycrystalline silicon has good adhesion to the active area 101, which can effectively connect the active area 101 with the bit line conductive layer formed later.

Figure 7:
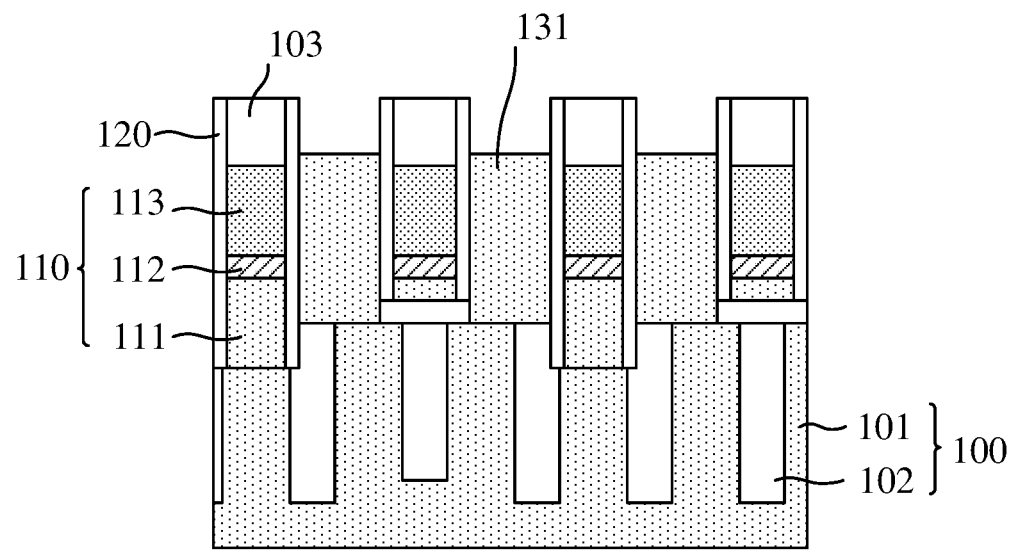

Referring to FIG. 7, the initial capacitor contact layer a131 (referring to FIG. 6) located on the upper surfaces of the isolation structures 120, on the upper surfaces of the insulating layers 103 and between parts of the isolation structures 120 is removed, and the rest of the initial capacitor contact layer a131 is taken as the capacitor contact layer 131.

In the present embodiment, the initial capacitor contact layer a131 located on the upper surfaces of the isolation structures 120, on the upper surfaces of the insulating layers 103 and between the parts of the isolation structures 120 is removed by the wet etching process. In other embodiments, a dry etching process may also be used.

The capacitor contact layer 131 is located between the adjacent isolation structures 120, an upper surface of the capacitor contact layer 131 is higher than the upper surface of each of the conductive structures 110, and the upper surface of the capacitor contact layer 131 is lower than the upper surface of the insulating layer 103.

The upper surface of the capacitor contact layer 131 is 5-15 nanometers, specifically 8 nanometers, 10 nanometers or 12 nanometers, higher than the upper surface of the bit line structure. Because the part of the isolation structure 120 needs to be removed later, and the upper surface of the isolation structure 120 after removal is flush with the upper surface of the capacitor contact layer 131, so the upper surface of the capacitor contact layer 131 is higher than the upper surface of the bit line structure, ensuring that the capacitor contact layer 131 will not electrically contact the bit line structure.

Figure 8:
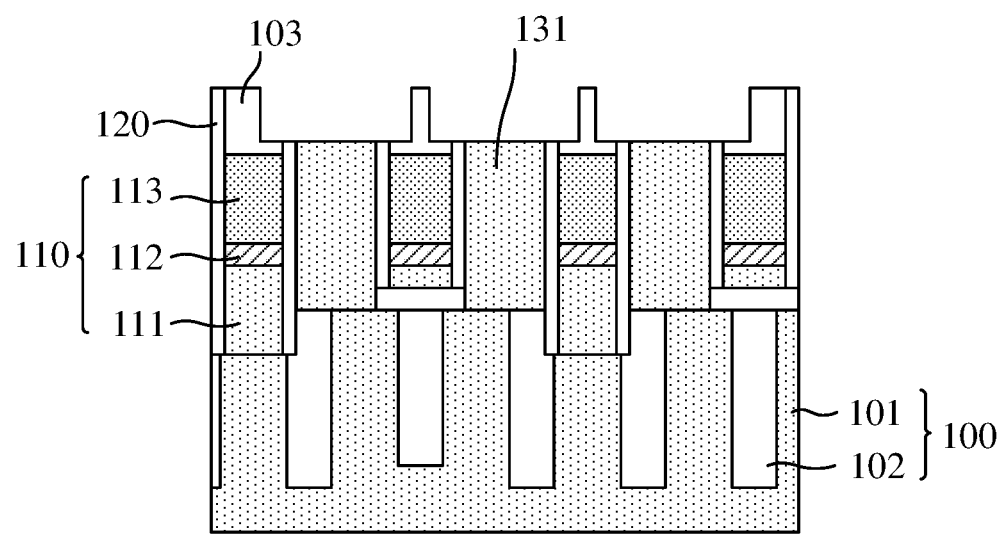

Referring to FIG. 8, a part of the isolation structure 120 located on the side wall of the insulating layer 103 and a part of the insulating layer 103 that is far away from a respective one of the conductive structures 110 are removed to form a trench; the removing steps and processes are the same as that stated above, so elaborations are omitted herein.

In the present embodiment, the upper surface of the capacitor contact layer 131 is flush with the upper surface of the isolation structure 120 after removal. In other embodiments, the upper surface of the capacitor contact layer may be higher or lower than the upper surface of the isolation structure after removal.

Figure 9:
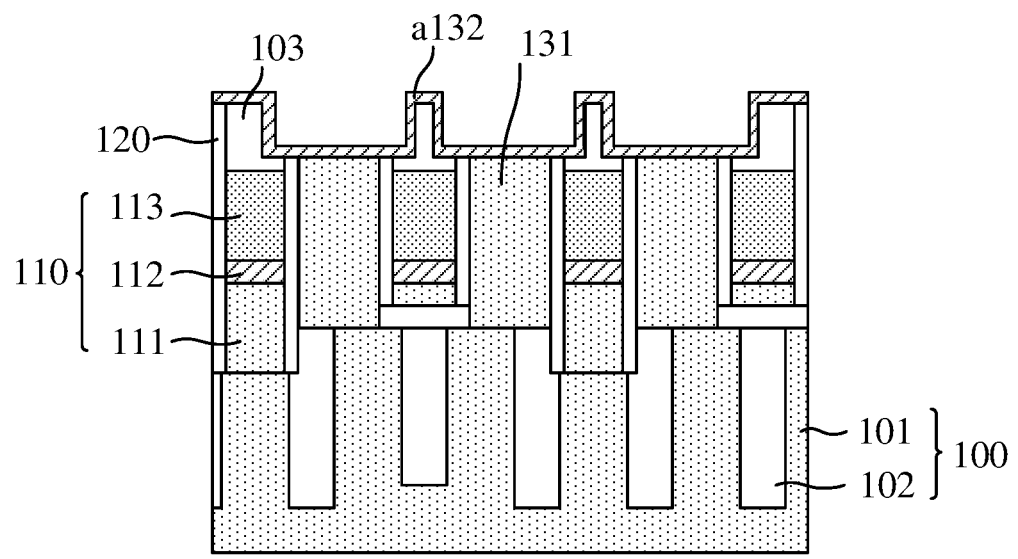

Referring to FIG. 9, after part of the insulating layer 103 is removed, an initial capacitor barrier layer a132 is formed on the surface of the capacitor contact layer 131, the surface of the isolation structure 120 and the surface of the insulating layer 103 which are exposed.

In the present embodiment, the initial capacitor barrier layer a132 is formed by a plasma deposition process. The material of the initial capacitor barrier layer a132 is titanium nitride or tantalum nitride. The initial capacitor barrier layer a132 is used for blocking the mutual diffusion between the capacitor conductive layer and the capacitor contact layer 131 formed later, and for increasing the adhesion between the capacitor conductive layer and the capacitor contact layer 131.

Figure 10:
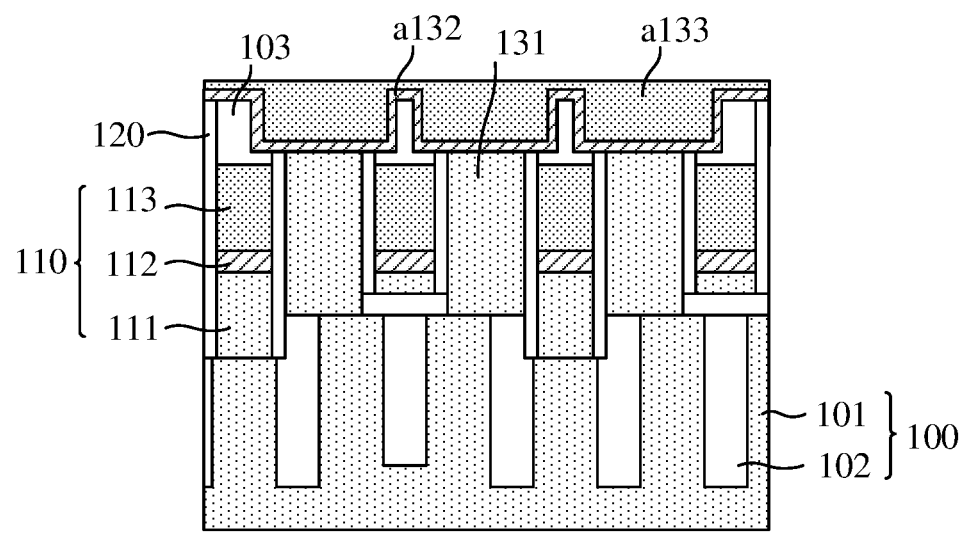

Referring to FIG. 10, an initial capacitor conductive layer a133 is formed on the surface of the initial capacitor barrier layer a132 by the chemical vapor deposition process. The material of the initial capacitor conductive layer a133 is tungsten or molybdenum, and the initial capacitor conductive layer a133 has a low resistance.

Figure 11:
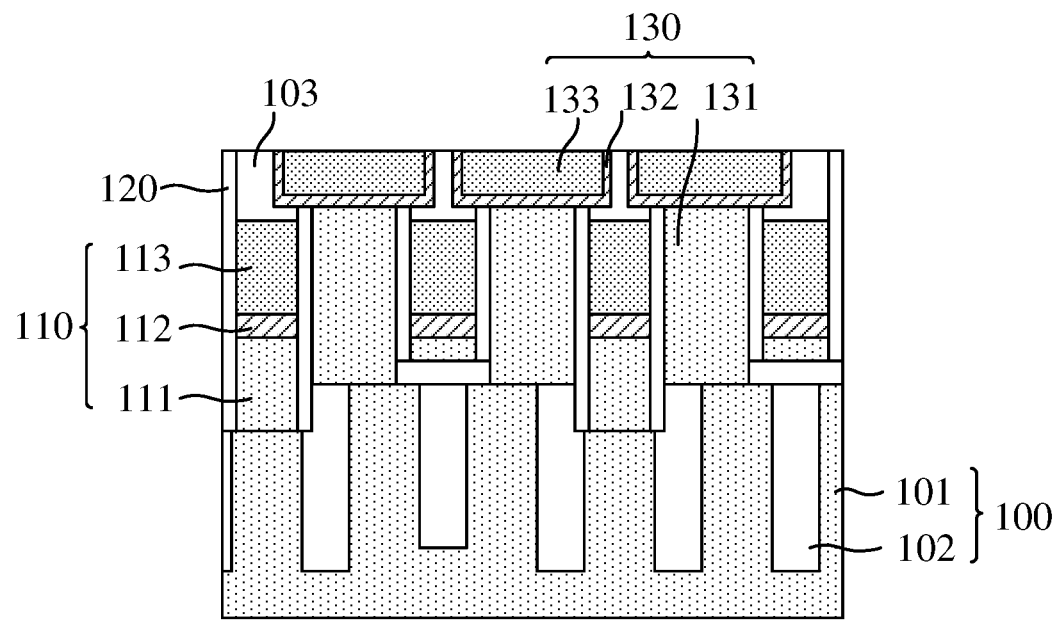

Referring to FIG. 11, a part of the initial capacitor barrier layer a132 (referring to FIG. 10) and a part of the initial capacitor conductive layer a133 (referring to FIG. 10) are removed by a chemical mechanical grinding process. An upper surface of the rest of the initial capacitor barrier layer a132 and an upper surface of the rest of the initial capacitor conductive layer a133 are flush with the upper surface of the insulating layer 103. The rest of the initial capacitor barrier layer a132 may be taken as the capacitor barrier layer 132; the rest of the initial capacitor conductive layer a133 may be taken as the capacitor conductive layer 133; and the conductive contact layer 133 filled in one of the trenches may be electrically insulated from the conductive contact layer filled in another one of the trenches.

In the present embodiment, the capacitor contact layer 131, the capacitor barrier layer 132 and the capacitor conductive layer 133 in each of the trenches constitute a capacitor contact structure 130. A width of an upper surface of the formed capacitor contact structure 130 is larger than a width of a lower surface of the formed capacitor contact structure, so the capacitor contact structure 130 has a large contact area with other electrical contact structures and thus has small contact resistance, which improves the performance of the semiconductor structure.

In the method for forming a semiconductor structure provided by the present embodiment, the width of the formed trench opening is larger than the width of the bottom of the trench, so the width of the upper surface of the formed conductive contact structure filling the trench is larger than the width of the lower surface of the formed conductive contact structure filling the trench, and thus the conductive contact area is large and the contact resistance is small; besides, because the opening of the trench is large, in the manufacturing process, the problems caused by the too small process dimension that the shape of a film layer formed is not standard or the removal is incomplete and there is residue in removing part of the film layer are reduced.

The second embodiment of the present disclosure provides another method for forming a semiconductor structure, which is basically the same as the first embodiment, except that the isolation structure formed in the second embodiment is a three-layer structure, which will be described below in detail in combination with the accompanying drawings.

FIG. 12 to FIG. 19 are structural schematic diagrams of the steps in a method for forming a semiconductor structure provided in the second embodiment of the present disclosure.

Figure 12:
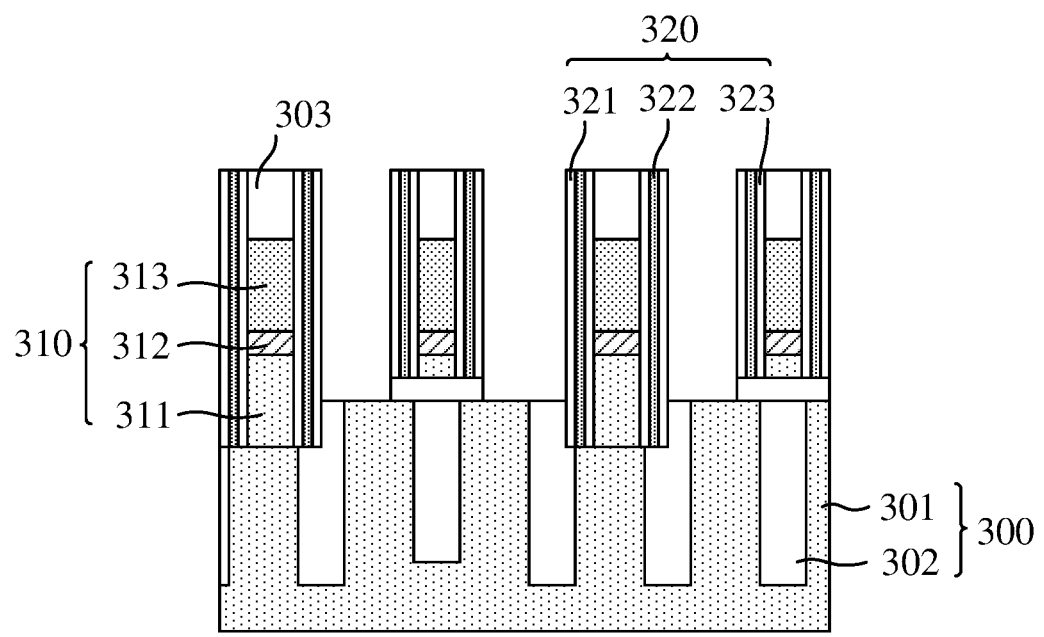
FIG. 12 to FIG. 19 are structural schematic diagrams of the steps in a method for forming a semiconductor structure provided in the second embodiment of the present disclosure.

Referring to FIG. 12, in the present embodiment, a substrate 300 is provided. The substrate 300 includes an active area 301 and an isolation layer 302. Discrete conductive structures 310 are formed on the substrate 300. The conductive structure 310 is a bit line structure, including a bit line contact layer 311, a bit line barrier layer 312 and a bit line conductive layer 313 which are stacked successively. An insulating layer 303 is formed on an upper surface of each of the conductive structures 310. An isolation structure 320 is formed on a side wall of each of the conductive structures 310 and a side wall of each of the insulating layers 303.

The isolation structure 320 includes a first isolation layer 321, a second isolation layer 322, and a third isolation layer 323. The second isolation layer 322 is located between the first isolation layer 321 and the third isolation layer 323, the first isolation layer 321 is close to a respective one of trenches formed later, and the third isolation layer 323 is in contact with a respective one of the conductive structures 310.

In the present embodiment, the material of the first isolation layer 321 is the same as that of the third isolation layer 323, the material of the first isolation layer 321 is different from that of the second isolation layer 322. The material of the first isolation layer 321 is silicon nitride, with large hardness and high density, which can improve the isolation effect to avoid the electrical connection between the bit line structure and the electrical contact structure formed later, thereby avoiding the problems such as short circuit or leakage. The material of the second isolation layer 322 is silicon oxide, with a low dielectric constant, which can reduce the parasitic capacitance between adjacent bit line structures, thereby improving the operating speed of the semiconductor structure.

Figure 13:
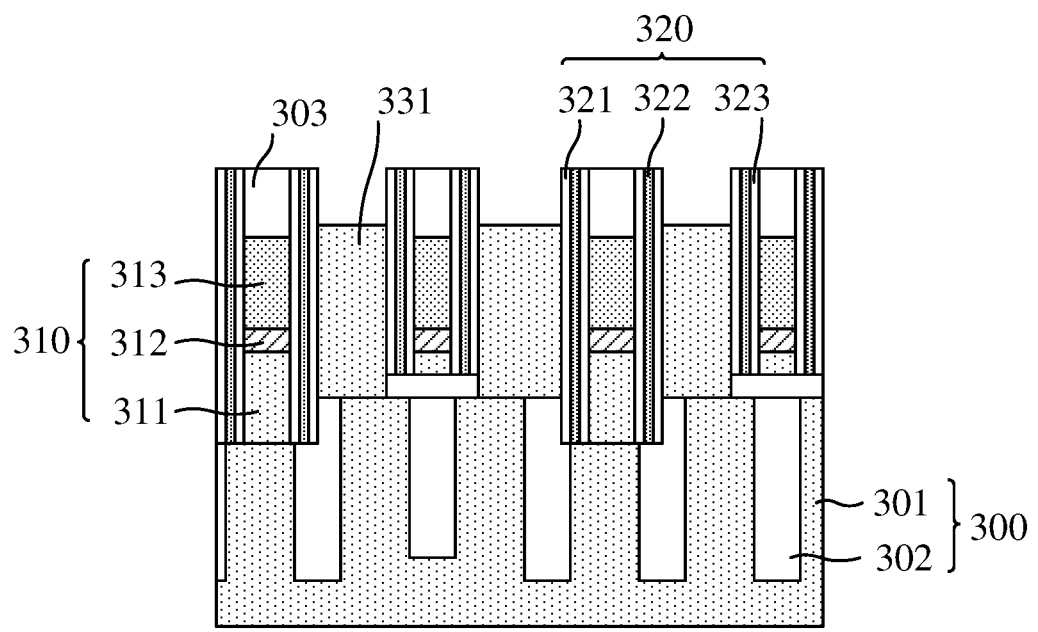

Referring to FIG. 13, a capacitor contact layer 331 is formed between the isolation structures 320. An upper surface of the capacitor contact layer 331 is higher than an upper surface of the conductive structure 310, and the upper surface of the capacitor contact layer 331 is lower than an upper surface of the insulating layer 303.

Figure 14:
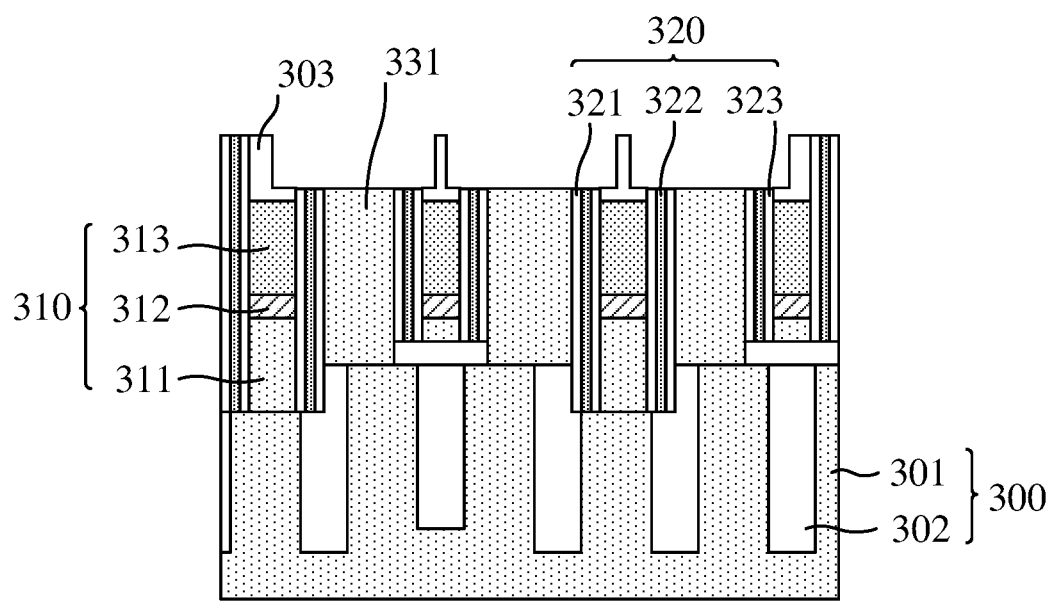

Referring to FIG. 14, a part of the isolation structure 320 located on the side wall of the insulating layer 303 and a part of the insulating layer 303 that is far away from a respective one of the conductive structures 310 are removed to form a trench. The removing steps and processes are the same as that stated above, so elaborations are omitted herein.

Figure 15:
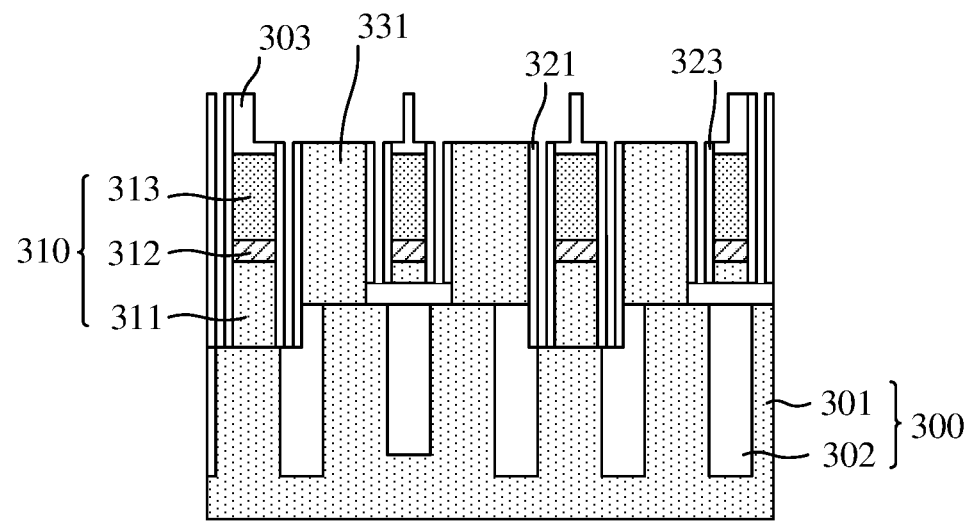

Referring to FIG. 15, the second isolation layer 322 (referring to FIG. 14) is removed to form a gap. The second isolation layer 322 is removed by the wet etching process to form a gap. The formation of gap in the isolation structure 320 is beneficial to reduce the parasitic capacitance between the adjacent bit line structures.

Figure 16:
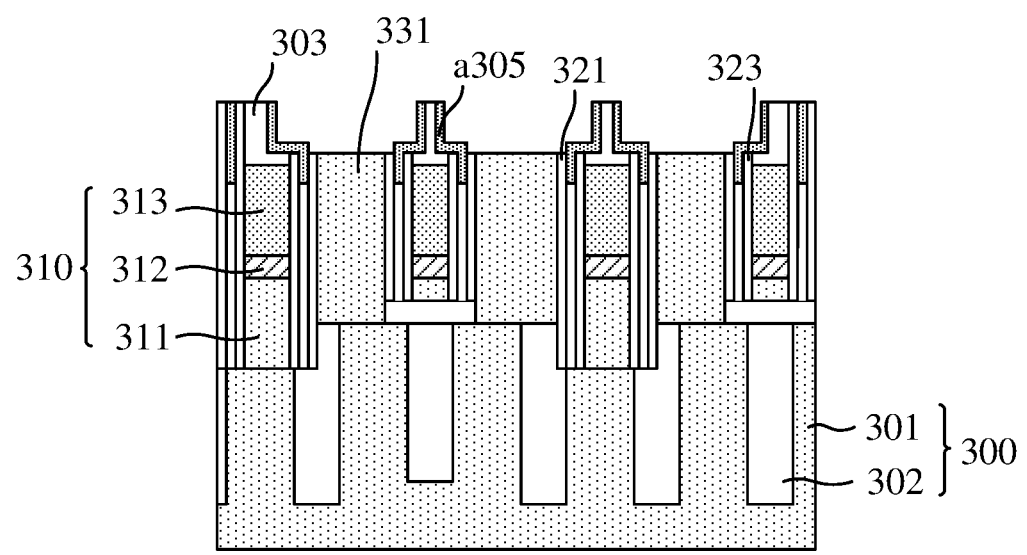
Figure 17:
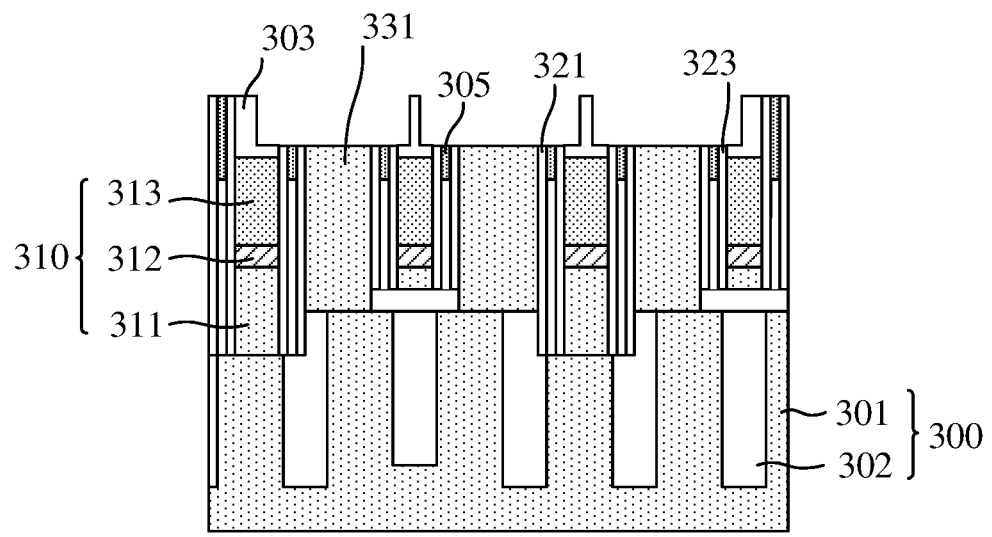

Referring to FIG. 16 and FIG. 17, an initial fill layer a305 is formed on a top of the gap and the side wall of the insulating layer 303, and then the initial fill layer a305 located on the side wall of the insulating layer 303 is removed, the rest of the initial fill layer a305 is taken as a fill layer 305.

In the present embodiment, the initial fill layer a305 is formed by the plasma deposition process. The fill layer 305 is located at the top of the gap, which can prevent the capacitor barrier layer formed later from entering the gap.

Figure 18:
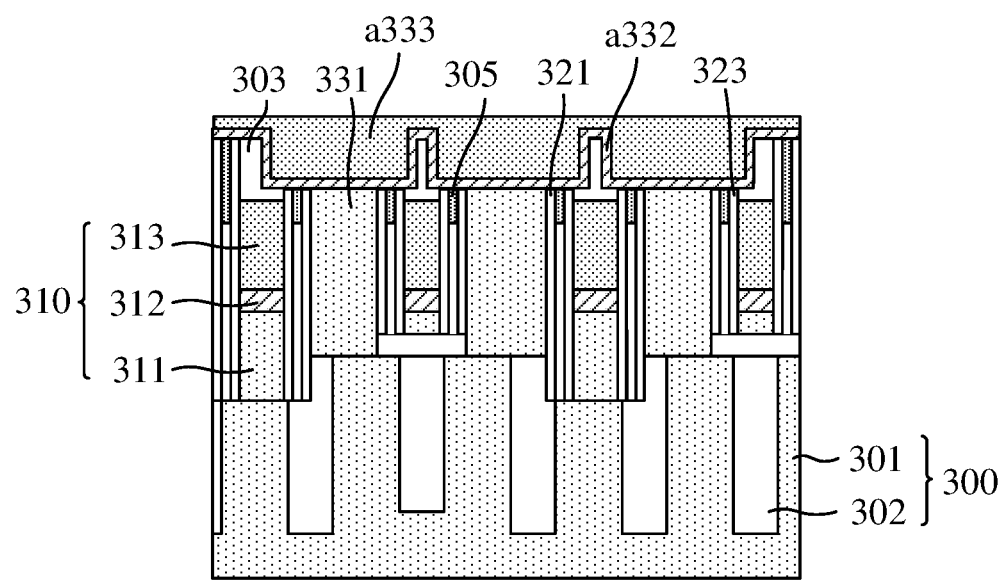

Referring to FIG. 18, an initial capacitor barrier layer a332 is formed on the surface of the capacitor contact layer 331, the surface of the isolation structure 320 and the surface of the insulating layer 303 which are exposed; an initial capacitor conductive layer a333 is formed on an surface of the initial capacitor barrier layer a332 by the chemical vapor deposition process. The material of the initial capacitor conductive layer a333 is tungsten or molybdenum, and the initial capacitor conductive layer a333 has a low resistance.

Figure 19:
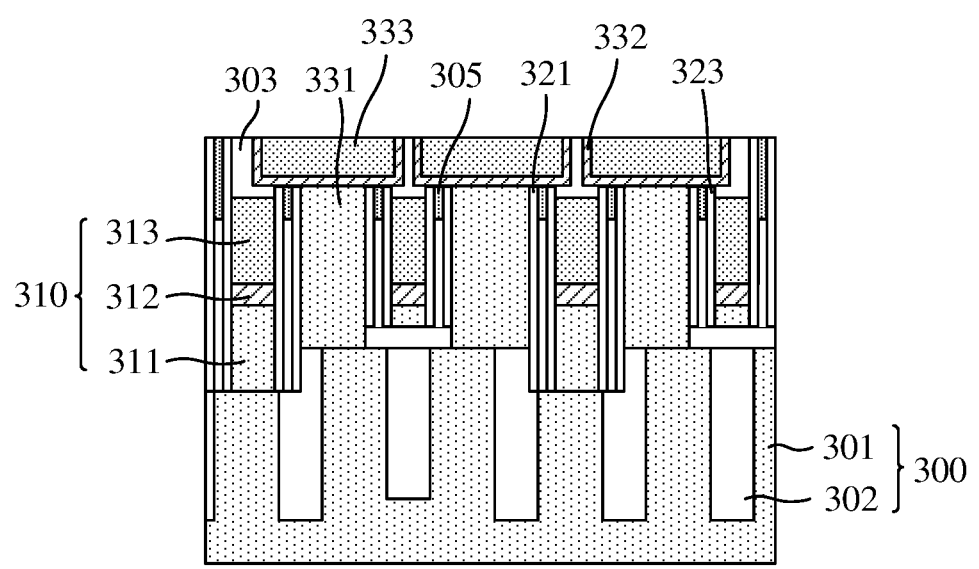

Referring to FIG. 19, a part of the initial capacitor barrier layer a332 (referring to FIG. 18) and a part of the initial capacitor conductive layer a333 (referring to FIG. 18) are removed by a chemical mechanical grinding process; the upper surface of the rest of the initial capacitor barrier layer a332 and the upper surface of the rest of the initial capacitor conductive layer a333 are flush with the upper surface of the insulating layer 103; the rest of the initial capacitor barrier layer a332 is taken as the capacitor barrier layer 332; the rest of the initial capacitor conductive layer a333 is taken as the capacitor conductive layer 333; and the conductive contact layer 333 filled in one of the trenches is electrically insulated from the conductive contact layer filled in another one of the trenches.

In the present embodiment, the capacitor contact layer 331, the capacitor barrier layer 332 and the capacitor conductive layer 333 in each of the trenches constitute a capacitor contact structure. The width of the upper surface of the formed capacitor contact structure is larger than the width of the lower surface of the formed capacitor contact structure, so the capacitor contact structure has a large contact area with other electrical contact structures and thus has small contact resistance, which improves the performance of the semiconductor structure.

In the method for forming a semiconductor structure provided by the present embodiment, when the isolation structure is a three-layer structure, a trench whose width at opening is larger than the width at bottom is formed, accordingly the width of the upper surface of the formed conductive contact structure filling the trench is larger than the width of the lower surface of the formed conductive contact structure filling the trench, and thus the conductive contact area is large and the contact resistance is small; besides, because the opening of the trench is large, in the manufacturing process, the problems caused by the too small process dimension that the shape of a film layer formed is not standard or the removal is incomplete and there is residue in removing part of the film layer are reduced.

The third embodiment of the present disclosure provides a semiconductor structure formed based on the forming method in the first embodiment or the second embodiment. The semiconductor structure will be described in detail below in combination with the accompanying drawings.

Referring to FIG. 4 and FIG. 5, the semiconductor structure may include: a substrate 100 and a plurality of discrete conductive structures 110 located on the substrate; an insulating layer 103 located on an upper surface of each of the conductive structures 110, a width of a top of the insulating layer 103 being less than a width of a bottom of the insulating layer 103 in a direction perpendicular to the side wall of the insulating layer 103; an isolation structure 120 located on a side wall of each of the conductive structures 110 and on a side wall of the insulating layer 103, the upper surface of the conductive structure 110 being lower than an upper surface of the isolation structure 120; and trenches 104 formed and surrounded by a surface of the substrate 100, the side walls of the isolation structures 120 and the side walls of the insulating layers 103. A width of an opening of each of the trenches 104 is larger than a width of a bottom of each of the trenches 104 in a direction perpendicular to a side wall of each of the trenches 104.

The substrate 100 includes a plurality of separate active areas 101, and each active area 101 has a source electrode and a drain electrode. The conductive structure 110 is electrically connected to the source electrode/drain electrode. The material of the active area 101 may be monocrystalline silicon, which has doped ions such as boron or phosphorus.

The substrate 100 also includes an isolation layer 102 for isolating the adjacent active areas 101. The materials of the isolation layer 102 are insulating materials, such as silicon dioxide, silicon carbide or silicon nitride.

In the present embodiment, the conductive structure 110 is a bit line structure. The bit line structure includes a bit line contact layer 111, a bit line barrier layer 112, and a bit line conductive layer 113 which are stacked.

Specifically, the bit line contact layer 111 is used for electrically connecting the bit line conductive layer 113 to the active area 101, and its material may be polycrystalline silicon. The bit line conductive layer 113 has a low resistance, and its material may be tungsten or molybdenum. The bit line barrier layer 112 is used for blocking the mutual diffusion between the bit line conductive layer 113 and the bit line contact layer 111, and for increasing the adhesion between the bit line conductive layer 113 and the bit line contact layer 111; and its material may be titanium nitrate or tantalum nitrate.

In the present embodiment, the isolation structure 120 is a single-layer structure, and the material of the isolation structure 120 is silicon nitride, which mainly plays the role of isolation and insulation. In other embodiments, the isolation structure may also be a multi-layer structure.

In the present embodiment, the material of the isolation structure 120 is the same as that of the insulating layer 103.

The isolation structure 120 has large hardness and high density, which can improve the isolation effect to avoid the electrical connection between the bit line structure and an electrical contact structure formed later, thereby avoiding the problems such as short circuit or leakage. In addition, the isolation structure 120 has better resistance to corrosion, thereby avoid being damaged during the cleaning process.

There are grooves at opposite sides of a top of the insulating layer 103. A bottom of each of the grooves is higher than or flush with the upper surface of the isolation structure 120. The insulating layer 103 is used for preventing the bit line conductive layer 113 from being oxidized, and its materials are insulating materials, such as silicon nitride.

In the present embodiment, a thickness of each of the grooves accounts for 2.5% to 25%, specifically 5%, 10% or 20% of a thickness of each of the conductive structures 110 in a direction parallel to the side wall of each of the conductive structure 110. If the width of the groove is within this range, the width of a trench formed later is increased, and the effect of electrical insulation and isolation of the rest of the insulating layer 103 is not affected.

The thickness of each of the grooves ranges from 1 nanometer to 20 nanometers, specifically is 5 nanometers, 10 nanometers or 15 nanometers, in the direction parallel to the side wall of each of the conductive structures 110.

Referring to FIG. 11, a conductive contact layer fully fills a respective one of the trenches 104 (referring to FIG. 4), and the conductive contact layers in different trenches 104 are electrically insulating from each other.

In the present embodiment, the capacitor contact layer is the capacitor contact structure 130; the conductive contact layer 131, the capacitor barrier layer 132 and the capacitor conductive layer 133 in each of the trenches constitute the capacitor contact structure 130. The width of the upper surface of the formed capacitor contact structure 130 is larger than the width of the lower surface of the formed capacitor contact structure, so the capacitor contact structure 130 has a large contact area with other electrical contact structures and thus has small contact resistance, which improves the performance of the semiconductor structure.

In other embodiments, referring to FIG. 19, the isolation structure is a three-layer structure; the isolation structure includes a fill layer 305, a first isolation layer 321, and a third isolation layer 323; there is a gap between the first isolation layer 321 and the third isolation layer 323; the fill layer 305 is located at a top of the gap; the first isolation layer 321 is close to the conductive fill layer filling a respective one of the trenches; the third isolation layer 323 is on a side wall of a respective one of the conductive structures 210.

The material of the first isolation layer 321 is the same as that of the third isolation layer 323. The material of the first isolation layer 321 is silicon nitride, which has large hardness and high density and can improve the isolation effect to avoid the electrical connection between the bit line structure and the electrical contact structure formed later, thereby avoiding the problems such as short circuit or leakage.

The isolation structure 320 has a gap, which is beneficial to reduce the parasitic capacitance between the adjacent bit line structures. The fill layer 305 is located at the top of the gap, which can prevent the capacitor barrier layer from entering the gap.

In the semiconductor structure provided by the present embodiment, the width of the opening of the trench is larger than the width of the bottom of the trench, so the width of the upper surface of the conductive contact layer filling the trench is larger than the width of the lower surface of the conductive contact layer filling the trench, accordingly the conductive contact area is large and the contact resistance is small; besides, because the opening of the trench is large, in the manufacturing process, the problems caused by the too small process dimension that the shape of a film layer formed is not standard or the removal is incomplete and there is residue in removing part of the film layer are reduced.

Those of ordinary skill in the art may understand that the above embodiments are the specific embodiments for implementing the present disclosure. In practical applications, various modifications may be made for them in form and detail without departing from the spirit and scope of the present disclosure. Those skilled in the art may make their own changes and modifications without departing from the spirit and scope of the present disclosure. Therefore, the scope of protection of the present disclosure shall be subject to the scope limited by the claims.

The invention claimed is:

1. A method for forming a semiconductor structure, comprising:

providing a substrate and a plurality of discrete conductive structures located on the substrate;

forming an insulating layer on an upper surface of each of the conductive structures;

forming an isolation structure, located on a side wall of each of the conductive structures and on a side wall of each of the insulating layers;

removing a part of the isolation structure located on the side wall of the insulating layer, wherein an upper surface of the rest of the isolation structure is higher than the upper surface of each of the conductive structures;

removing a part of the insulating layer that is far away from a respective one of the conductive structures, wherein a width of a top of the rest of the insulating layer is less than a width of a bottom of the rest of the insulating layer, in a direction perpendicular to the side wall of the insulating layer; and after removing the part of the insulating layer that is far away from the respective one of the conductive structures, trenches are formed and surrounded by a surface of the substrate, the side walls of the isolation structures and the side walls of the insulating layers, wherein a width of an opening of each of the trenches is larger than a width of a bottom of each of the trenches in a direction perpendicular to side walls of the trenches;

wherein removing the part of the insulating layer that is far away from the respective one of the conductive structures comprises: removing two opposite sides of a top of the insulating layer, so that grooves are formed at two ends of the top of each of the insulating layers, a bottom of each of the grooves being higher than or flush with the upper surface of the rest of the isolation structure;

wherein a thickness of each of the grooves accounts for 2.5% to 25% of a thickness of each of the conductive structures, in a direction parallel to the side wall of each of the conductive structures; and wherein the thickness of each of the grooves is 1 nanometer to 20 nanometers, in the direction parallel to the side wall of each of the conductive structures.

2. The method for forming a semiconductor structure of claim 1, wherein the part of the isolation structure located on the side wall of the insulating layer and the part of the insulating layer that is far away from the respective one of the conductive structures are removed by isotropic etching.

3. The method for forming a semiconductor structure of claim 1, wherein the isolation structure comprises a first isolation layer, a second isolation layer and a third isolation layer; the second isolation layer being located between the first isolation layer and the third isolation layer, the first isolation layer being close to a respective one of the trenches, and the third isolation layer is in contact with a respective one of the conductive structures;

wherein the method, after removing the part of the insulating layer that is far away from the respective one of the conductive structures, comprises removing the second isolation layer to form a gap, and forming a fill layer on a top of the gap.

4. The method for forming a semiconductor structure of claim 3, wherein forming the fill layer comprises: forming an initial fill layer on the top of the gap and the side wall of the insulating layer, and then removing the initial fill layer located on the side wall of the insulating layer, wherein the rest of the initial fill layer serves as the fill layer.

5. The method for forming a semiconductor structure of claim 3, wherein a material of the first isolation layer is the same as a material of the third isolation layer, and the material of the first isolation layer is different from a material of the second isolation layer.

6. The method for forming a semiconductor structure of claim 1, comprising
forming a conductive contact layer fully filling a respective one of the trenches, wherein the conductive contact layer in one of the trenches is electrically insulated from the conductive contact layer in another one of the trenches.

7. The method for forming a semiconductor structure of claim 1, wherein
each of the conductive structures is a bit line structure; wherein the method, after forming the isolation structure and before removing the part of the isolation structure, comprises forming a capacitor contact layer on the substrate, wherein the capacitor contact layer is located between adjacent isolation structures of the isolation structures, an upper surface of the capacitor contact layer is higher than an upper surface of the bit line structure, and the upper surface of the capacitor contact layer is lower than an upper surface of the insulating layer;
wherein the method further comprises:
forming a capacitor barrier layer on the surface of the capacitor contact layer, the surface of the isolation structure and the side wall of the insulating layer which are exposed, after removing the part of the insulating layer; and
forming a capacitor conductive layer filling a respective one of the trenches on a surface of the capacitor barrier layer, wherein the capacitor conductive layer filling one of the trenches is electrically insulated from the capacitor conductive layer filling another one of the trenches;
wherein a capacitor contact structure is formed by the capacitor contact layer, the capacitor barrier layer and the capacitor conductive layer in each of the trenches.

8. The method for forming a semiconductor structure of claim 7, wherein
forming the capacitor contact layer comprises: forming an initial capacitor contact layer between the isolation structures, on the upper surfaces of the isolation structures and on the upper surfaces of the insulating layers; and removing the initial capacitor contact layer located on the upper surfaces of the isolation structures, the upper surfaces of the insulating layers and between parts of the isolation structures, the rest of the initial capacitor contact layer serving as the capacitor contact layer.

9. The method for forming a semiconductor structure of claim 8, wherein
the upper surface of the capacitor contact layer is 5 nanometers to 15 nanometers higher than the upper surface of the bit line structure.

10. A semiconductor structure, comprising:
a substrate and a plurality of discrete conductive structures located on the substrate;
an insulating layer located on an upper surface of each of the conductive structures;
a width of a top of the insulating layer is less than a width of a bottom of the insulating layer in a direction perpendicular to a side wall of the insulating layer;
an isolation structure, located on a side wall of each of the conductive structures and on the side wall of the insulating layer; wherein an upper surface of each of the conductive structures is lower than an upper surface of the isolation structure; and
trenches, formed and surrounded by a surface of the substrate, the side walls of the isolation structures and the side walls of the insulating layers; a width of an opening of each of the trenches is larger than a width of a bottom of each of the trenches in a direction perpendicular to a side wall of each of the trenches;
wherein there are grooves at opposite sides of a top of the insulating layer, and a bottom of each of the grooves is higher than or flush with the upper surface of the isolation structure;
wherein a thickness of each of the grooves accounts for 2.5% to 25% of a thickness of each of the conductive structures, in a direction parallel to the side wall of each of the conductive structures; and
wherein the thickness of each of the grooves is 1 nanometer to 20 nanometers, in the direction parallel to the side wall of each of the conductive structures.

11. The semiconductor structure of claim 10, wherein a conductive contact layer fully fills a respective one of the trenches, and the conductive contact layer in one of the trenches is electrically insulated from the conductive contact layer in another one of the trenches.

12. The semiconductor structure of claim 10, wherein
the isolation structure comprises a fill layer, a first isolation layer, and a third isolation layer; there is a gap between the first isolation layer and the third isolation layer; the fill layer is located on a top of the gap, the first isolation layer is close to a respective one of the trenches; the third isolation layer is on a side wall of a respective one of the conductive structures.

13. The semiconductor structure of claim 11, wherein
the conductive contact layer is a capacitor contact structure formed by a capacitor contact layer, a capacitor barrier layer and a capacitor conductive layer in each of the trenches.

14. The semiconductor structure of claim 10, wherein
each of the conductive structures is a bit line structure comprising a bit line contact layer, a bit line barrier layer, and a bit line conductive layer which are stacked.

* * * * *